(12) United States Patent
Schlueter

(10) Patent No.: US 11,398,768 B2
(45) Date of Patent: Jul. 26, 2022

(54) SEMICONDUCTOR MODULE ARRANGEMENT WITH FAST SWITCHING, REDUCED LOSSES, AND LOW VOLTAGE OVERSHOOT AND METHOD FOR OPERATING THE SAME

(71) Applicant: Infineon Technologies AG, Neubiberg (DE)

(72) Inventor: Michael Schlueter, Soest (DE)

(73) Assignee: Infineon Technologies AG

( * ) Notice: Subject to any disclaimer, the term of this patent is extended or adjusted under 35 U.S.C. 154(b) by 118 days.

(21) Appl. No.: 16/931,865

(22) Filed: Jul. 17, 2020

(65) Prior Publication Data

US 2021/0036597 A1 Feb. 4, 2021

(30) Foreign Application Priority Data

Jul. 30, 2019 (EP) ..................................... 19188978

(51) Int. Cl.
*H02M 1/08* (2006.01)
*H01L 25/16* (2006.01)
(Continued)

(52) U.S. Cl.
CPC ............ *H02M 1/08* (2013.01); *H01L 25/165* (2013.01); *H02M 7/5387* (2013.01);
(Continued)

(58) Field of Classification Search
CPC ........ H02M 1/00; H02M 1/08; H02M 1/0048; H02M 7/5387; H01L 23/049; H01L 23/15; H01L 23/49822; H01L 23/528; H01L 23/585; H01L 23/5386; H01L 25/165; H01L 25/0652; H01L 24/48; (Continued)

(56) References Cited

U.S. PATENT DOCUMENTS 8,581,147 B2 * 11/2013 Kooken ................ H02M 3/158
219/137.7
9,276,489 B2 3/2016 Fujita et al.
(Continued)

FOREIGN PATENT DOCUMENTS

EP 2439839 A4 7/2017

*Primary Examiner* — Kyle J Moody
*Assistant Examiner* — Jye-June Lee
(74) *Attorney, Agent, or Firm* — Design IP

(57) ABSTRACT

A semiconductor module arrangement includes an input stage including a first output terminal and a second output terminal, wherein a first inductive element is coupled to the first output terminal; an output stage including at least one first controllable semiconductor element, a third input terminal coupled to the first inductive element such that the first inductive element is coupled between the first output terminal and the third input terminal, a fourth input terminal coupled to the second output terminal, a third output terminal, and a fourth output terminal; a second controllable semiconductor element and a first capacitive element coupled in series and between a first common node coupled between the first inductive element and the third input terminal, and a second common node coupled between the second output terminal and the fourth input terminal; and a first diode element coupled in parallel to the second controllable semiconductor element.

18 Claims, 5 Drawing Sheets

(51) Int. Cl.
  *H02M 7/5387* (2007.01)
  *H01L 23/049* (2006.01)
  *H01L 23/15* (2006.01)
  *H01L 23/498* (2006.01)
  *H01L 23/00* (2006.01)
(52) U.S. Cl.
  CPC ............ *H01L 23/049* (2013.01); *H01L 23/15* (2013.01); *H01L 23/49822* (2013.01); *H01L 24/48* (2013.01); *H01L 2224/48225* (2013.01)
(58) Field of Classification Search
  CPC ........ H01L 2224/48225; H03K 17/162; H03K 17/145; Y02B 70/10
  See application file for complete search history.

(56) References Cited

U.S. PATENT DOCUMENTS

| | | | |
|---|---|---|---|
| 10,811,984 B2* | 10/2020 | Schekulin | H02M 3/33592 |
| 2012/0224396 A1* | 9/2012 | Nozaki | H02M 3/3378 363/17 |
| 2019/0028035 A1* | 1/2019 | Choi | H02M 1/32 |

* cited by examiner

SEMICONDUCTOR MODULE ARRANGEMENT WITH FAST SWITCHING, REDUCED LOSSES, AND LOW VOLTAGE OVERSHOOT AND METHOD FOR OPERATING THE SAME

FIELD

The instant disclosure relates to a semiconductor module arrangement comprising controllable semiconductor elements, and a method for operating the semiconductor module arrangement.

BACKGROUND

Semiconductor arrangements, like power semiconductor modules or the like, are widely used in automotive, industrial, and consumer electronic applications for driving loads, converting power, or the like. Such a semiconductor arrangement may include one or more than one controllable semiconductor elements. Two or more controllable semiconductor elements may form a half-bridge arrangement, for example. Many applications require fast switching of the controllable semiconductor elements, while at the same time the overall losses of the arrangement preferably are low. Even further, an electric strength of the arrangement should be sufficient in order for the arrangement to withstand even high voltage overshoots that may occur in the moment when the controllable semiconductor elements are switched off.

There is a general need for a semiconductor module arrangement that allow for a fast switching of the controllable semiconductor elements while, at the same time, keeping the overall losses low and generating a low voltage overshoot in the moment of switch off.

SUMMARY

A semiconductor module arrangement includes an input stage including a first output terminal, and a second output terminal, wherein a first inductive element is coupled to the first output terminal. The semiconductor module arrangement further includes an output stage including at least one controllable semiconductor element, a third input terminal coupled to the first inductive element such that the first inductive element is coupled between the first output terminal and the third input terminal, a fourth input terminal coupled to the second output terminal, a third output terminal, and a fourth output terminal. The arrangement further includes a first controllable semiconductor element and a first capacitive element coupled in series and between a common node between the first inductive element and the third input terminal, and a common node between the second output terminal and the fourth input terminal, and a first diode element coupled in parallel to the first controllable semiconductor element, wherein a cathode terminal of the first diode element is coupled to the first capacitive element, and an anode terminal of the first diode element is coupled to the common node between the first inductive element and the third input terminal.

A method for operating the semiconductor arrangement includes switching on at least one controllable semiconductor element of the at least one controllable semiconductor element of the output stage, wherein the first inductive element is charged during the switch on operation of the at least one controllable semiconductor element, and wherein energy that is stored in the first inductive element during the switch on operation commutates to the first capacitive element via the first diode element once the switch on operation is completed. The method further includes switching off the at least one controllable semiconductor element of the at least one controllable semiconductor element of the output stage, wherein the first controllable semiconductor element is in a blocking state at least during the switch on operation of the at least one controllable semiconductor element.

The invention may be better understood with reference to the following drawings and the description. The components in the figures are not necessarily to scale, emphasis instead being placed upon illustrating the principles of the invention. In the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line as described herein may be a single electrically conductive element, or include at least two individual electrically conductive elements connected in series and/or parallel. Electrical lines may include metal and/or semiconductor material, and may be permanently electrically conductive (i.e., non-switchable). An electrical line may have an electrical resistivity that is independent from the direction of a current flowing through it. A semiconductor body as described herein may be made of (doped) semiconductor material and may be a semiconductor chip or be included in a semiconductor chip. A semiconductor body has electrically connecting pads and includes at least one semiconductor element with electrodes. The pads are electrically connected to the electrodes which includes that the pads are the electrodes and vice versa.

Figure 1:
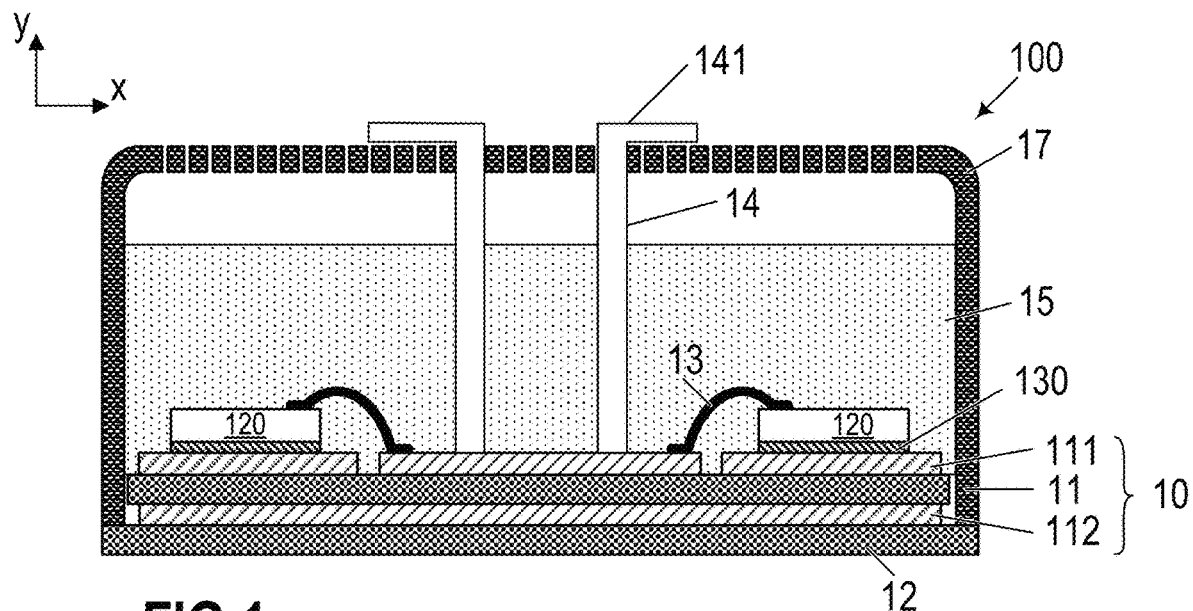
FIG. 1 schematically illustrates a cross-sectional view of a semiconductor module arrangement.

Referring to FIG. 1, a cross-sectional view of a power semiconductor module arrangement 100 is schematically illustrated. The power semiconductor module arrangement 100 includes a housing 17 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 17. In the example illustrated in FIG. 1, the semiconductor substrate 10 is arranged on a base plate 12 which forms a ground surface of the housing 17, while the housing 17 itself solely comprises sidewalls and a cover. This is, however, only an example. It is also possible that the housing 17 further comprises a ground surface and the semiconductor substrate 10 and an (optional) base plate 12 be arranged inside the housing 17. In some power semiconductor module arrangements 100, more than one semiconductor substrate 10 is arranged on a single base plate 12 or on the ground surface of a housing 17. In other power semiconductor module arrangements 100, the semiconductor substrate 10 itself may form a ground surface of the housing 17. A power semiconductor module arrangements 100 in the latter case generally does not comprise a base plate 12.

One or more semiconductor bodies 120 may be arranged on the at least one semiconductor substrate 10. Each of the semiconductor bodies 120 arranged on the at least one semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 120 may form a semiconductor arrangement on the at least one semiconductor substrate 10. In FIG. 1, only two semiconductor bodies 120 are exemplarily illustrated. The second metallization layer 112 of the semiconductor substrate 10 in FIG. 1 is a continuous layer. The first metallization layer 111 is a structured layer in the example illustrated in FIG. 1. "Structured layer" in this context means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 120 may be mounted to the same or to different sections of the first metallization layer 111. Different sections of the first metallization layer 111 may have no electrical connection or may be electrically connected to one or more other sections using, e.g., bonding wires 13. Electrical connections 13 may also include connection plates or conductor rails, for example, to name just a few examples. The one or more semiconductor bodies 120 may be electrically and mechanically connected to the semiconductor substrate 10 by an electrically conductive connection layer 130. Such an electrically conductive connection layer may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 14. The terminal elements 14 are electrically connected to the first metallization layer 111 and provide an electrical connection between the inside and the outside of the housing 17. The terminal elements 14 may be electrically connected to the first metallization layer 111 with a first end, while a second end 141 of each of the terminal elements 14 protrudes out of the housing 17. The terminal elements 14 may be electrically contacted from the outside at their respective second ends 141. A first part of the terminal elements 14 may extend through the inside of the housing 17 in a vertical direction y. The vertical direction y is a direction perpendicular to a top surface of the semiconductor substrate 10, wherein the top surface of the semiconductor substrate 10 is a surface on which the at least one semiconductor body 120 is mounted. The terminal elements 14 illustrated in FIG. 1, however, are only examples. Terminal elements 14 may be implemented in any other way and may be arranged anywhere within the housing 17. For example, one or more terminal elements 14 may be arranged close to or adjacent to the sidewalls of the housing 17. Terminal elements 14 could also protrude vertically or horizontally through the sidewalls of the housing 17 instead of through the cover.

The semiconductor bodies 120 each may include a chip pad metallization (not specifically illustrated), e.g., a source, drain, emitter, collector, anode, cathode or gate metallization. A chip pad metallization generally provides a contact surface for electrically connecting the semiconductor body 120. The chip pad metallization may electrically contact a connection layer 130, a terminal element 14, or an electrical connection 13, for example. A chip pad metallization may consist of or include a metal such as aluminum, copper, gold or silver, for example. The electrical connections 13 and the terminal elements 14 may also consist of or include a metal such as copper, aluminum, gold, or silver, for example.

The power semiconductor module arrangement 100 generally further includes a casting compound 15. The casting compound 15 may consist of or include a silicone gel or may be a rigid molding compound, for example. The casting compound 15 may at least partly fil the interior of the housing 17, thereby covering the components and electrical connections that are arranged on the semiconductor substrate 10. The terminal elements 14 may be partly embedded in the casting compound 15. At least their second ends 141, however, are not covered by the casting compound 15 and protrude from the casting compound 15 through the housing 17 to the outside of the housing 17. The casting compound 15 is configured to protect the components and electrical connections inside the power semiconductor module 100, in particular inside the housing 17, from certain environmental conditions and mechanical damage. It is generally also possible to omit the housing 17 and solely protect the substrate 10 and any components mounted thereon with a casting compound 15. In this case, the casting compound 15 may be a rigid material, for example.

As has been described above, two or more semiconductor bodies 120 may form a semiconductor arrangement on the at least one semiconductor substrate 10. According to one example, two or more semiconductor bodies 120 may be arranged in a half-bridge arrangement. Any other semiconductor arrangement comprising one, two, or more than two controllable semiconductor elements are generally possible, each controllable semiconductor element having a load path formed between a first load electrode (e.g. a source electrode or an emitter electrode) and a second load electrode (e.g. a drain electrode or a collector electrode), and a control electrode (e.g. a gate or base electrode).

Figure 2:
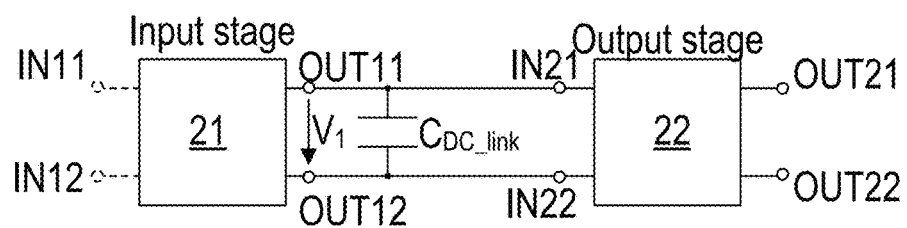
FIG. 2 is a circuit diagram of a semiconductor arrangement comprising a DC-link capacitor.

Now referring to FIG. 2, a semiconductor arrangement is schematically illustrated. The semiconductor arrangement comprises an input stage 21 and an output stage 22. The input stage 21 comprises a first input terminal IN11, a second input terminal IN12, a first output terminal OUT11, and a second output terminal OUT12. The output stage 22 comprises a third input terminal IN21, a fourth input terminal IN22, a third output terminal OUT21, and a fourth output terminal OUT22. The input stage 21 may be configured to perform an AC-DC conversion (convert an AC voltage provided at its input terminals IN11, IN12 to a DC voltage V1 provided at its output terminals OUT11, OUT12) or a DC-DC conversion (convert a DC voltage provided at its input terminals IN11, IN12 to another DC voltage V1 provided at its output terminals OUT11, OUT12), for example. The output stage 22 may be configured to perform a DC-DC conversion (convert a DC voltage provided at its input terminals IN21, IN22 to another DC voltage provided at its output terminals OUT21, OUT22) or a DC-AC conversion (convert a DC voltage provided at its input terminals IN21, IN22 to an AC voltage provided at its output terminals OUT21, OUT22), for example. According to another example, the input stage 21 may comprise a voltage source (e.g., a battery or a large capacitor) that provides a first voltage V1 at its output terminals OUT11, OUT12. If the input stage 21 comprises only a voltage source, the input terminals IN11, IN12 may be omitted. The input terminals IN11, IN12 of the input stage 21, therefore, are indicated in dashed lines.

A DC-link capacitor $C_{DC\_link}$ may be coupled between a common node between the first output terminal OUT11 and the third input terminal IN21, and a common node between the second output terminal OUT12 and the fourth input terminal IN22. The DC-link capacitor $C_{DC\_link}$ is configured to provide a stable DC voltage at the input terminals IN21, IN22 of the output stage 22. The DC-link capacitor $C_{DC\_link}$ reduces ripples and limits fluctuations of the output voltage V1 provided at the outputs OUT11, OUT12 of the input stage 21.

The output stage 22 may comprise at least one controllable semiconductor element. As has been described above, each of the at least one controllable semiconductor element may be provided as a separate semiconductor body 120. The semiconductor bodies 120 may be arranged in a housing 17, for example. The DC-link capacitor $C_{DC\_link}$ may also be arranged in the same housing 17 as the semiconductor bodies 120, for example. The different semiconductor bodies 120 of the arrangement may be arranged on one or two semiconductor substrates 10 that are arranged within the same housing 17.

In many applications, fast switching of the at least one controllable semiconductor element of the output stage 22 may be desirable. If a high performance of the power semiconductor module arrangement is required, a stray inductance occurring between the DC-link capacitor $C_{DC\_link}$ and the at least one controllable semiconductor element of the output stage 22 may be high and may negatively affect the switching speed of the controllable semiconductor elements. This again may negatively affect the overall losses of the power semiconductor module arrangement. A high stray inductance may further result in a high voltage overshoot in the moment of switching off at least one of the controllable semiconductor elements. This requires a sufficiently high electric strength of the semiconductor bodies 120 of the semiconductor arrangement.

In order to reduce the stray inductance between the DC-link capacitor $C_{DC\_link}$ and the at least one controllable semiconductor element of the output stage 22 the arrangement may comprise an additional capacitor $C_s$. Such an additional capacitor $C_s$ may also be referred to as snubber capacitor, for example. The additional capacitor $C_s$ may be coupled in parallel to a DC-link capacitor $C_{DC\_link}$, for example (not specifically illustrated in FIG. 2). The additional capacitor $C_s$ and the at least one controllable semiconductor element may be arranged close to each other (in close proximity to each other) within the housing 17. That is, a distance between the additional capacitor $C_s$ and the at least one controllable semiconductor element of the output stage 22 may be as short as possible. According to another example, the additional capacitor $C_s$ may be arranged outside the housing 17, e.g., on an external printed circuit board. A low inductive connecting element could be used to electrically couple the additional capacitor $C_s$ to the elements arranged inside the housing 17.

Figure 3:
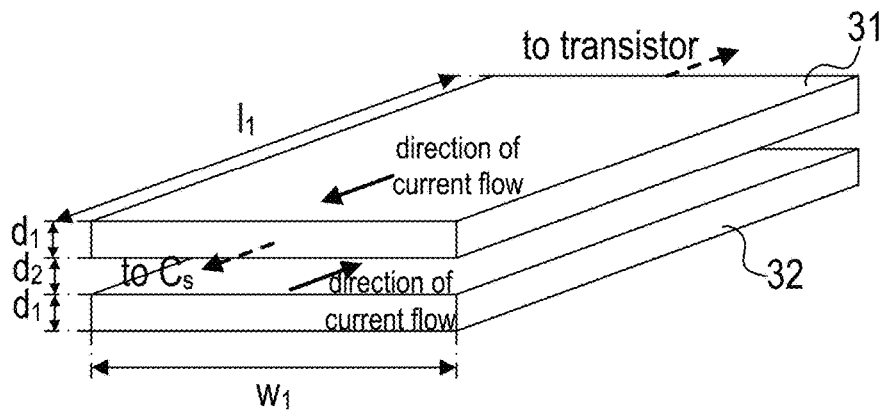
FIG. 3 schematically illustrates an exemplary ribbon conductor for electrically coupling a DC-link capacitor to a controllable semiconductor element.

An exemplary electrical connection between an additional capacitor $C_s$ and the at least one controllable semiconductor element of the output stage 22 is schematically illustrated in FIG. 3. In particular, FIG. 3 schematically illustrates a ribbon conductor for electrically coupling an additional capacitor $C_s$ to a controllable semiconductor element (e.g., transistor) of the output stage 22. The ribbon conductor may comprise a first electrically conducting layer 31 and a second electrically conducting layer 32. Each of the first electrically conducting layer 31 and the second electrically conducting layer 32 may have a width $w_1$ in a first direction, a length $l_1$ in a second direction, and a thickness $d_1$ in a third direction, the first, second and third directions being perpendicular to each other, wherein the thickness $d_1$ is considerably smaller than each of the width $w_1$ and the length $l_1$ (e.g., $d_1<0.5*w_1$, or $d_1<0.5*l_1$). The first electrically conducting layer 31 is arranged above and parallel to the second conductive layer 32. The first electrically conducting layer 31 may be arranged at a distance $d_2$ above the second electrically conducting layer 32 in the third direction. A dielectrically insulating layer (not specifically illustrated in FIG. 3) may be arranged between the first electrically conducting layer 31 and the second electrically conducting layer 32 in order to dielectrically isolate the first electrically conducting layer 31 from the second electrically conducting layer 32. A controllable semiconductor element (e.g., transistor) may be arranged at one end of the first and second electrically conducting layers 31, 32, and an additional capacitor $C_s$ may be arranged at an opposite end of the first and second electrically conducting layers 31, 32 in the second direction as is indicated in FIG. 3 by means of the dot-dashed arrows. A current may flow from the controllable semiconductor element (e.g., transistor) to the additional capacitor $C_s$ through the first electrically conducting layer 31, and back from the additional capacitor $C_s$ to the controllable semiconductor element through the second electrically conducting layer 32. The direction of current flow is indicated by means of the solid line arrows in FIG. 3.

By reducing the length $l_1$ of the first and second electrically conducting layers 31, 32, the distance between the controllable semiconductor element and the additional capacitor $C_s$ is reduced, and, therefore, the stray inductance may also be reduced. Reducing the length $l_1$ of the first and second conductive layers 31, 32, however, may increase the overall cost of the power semiconductor module arrangement. The width $w_1$ may be chosen to be comparably large, in order to reduce the ohmic resistance of the first and second electrically conducting layers 31, 32. For the stray inductance $L_{stray}$ of the arrangement, the following dependency applies $$L_{stray} \sim \frac{d_2 * l_1}{w_1}$$

Within this document, the term proximity with regard to the additional capacitor $C_s$ and the controllable semiconductor elements of the output stage 22 refers to an electrical proximity. That is, it refers to the connection causing the stray inductance $L_{stray}$.

In many power semiconductor module arrangements it is difficult or even impossible to arrange the additional capacitor $C_s$ in close proximity to the controllable semiconductor elements of the output stage with a (short) electrical connection (e.g., ribbon conductor) as has been described with respect to FIG. 3 arranged between the additional capacitor $C_s$ and the controllable semiconductor elements of the output stage 22.

Figure 4:
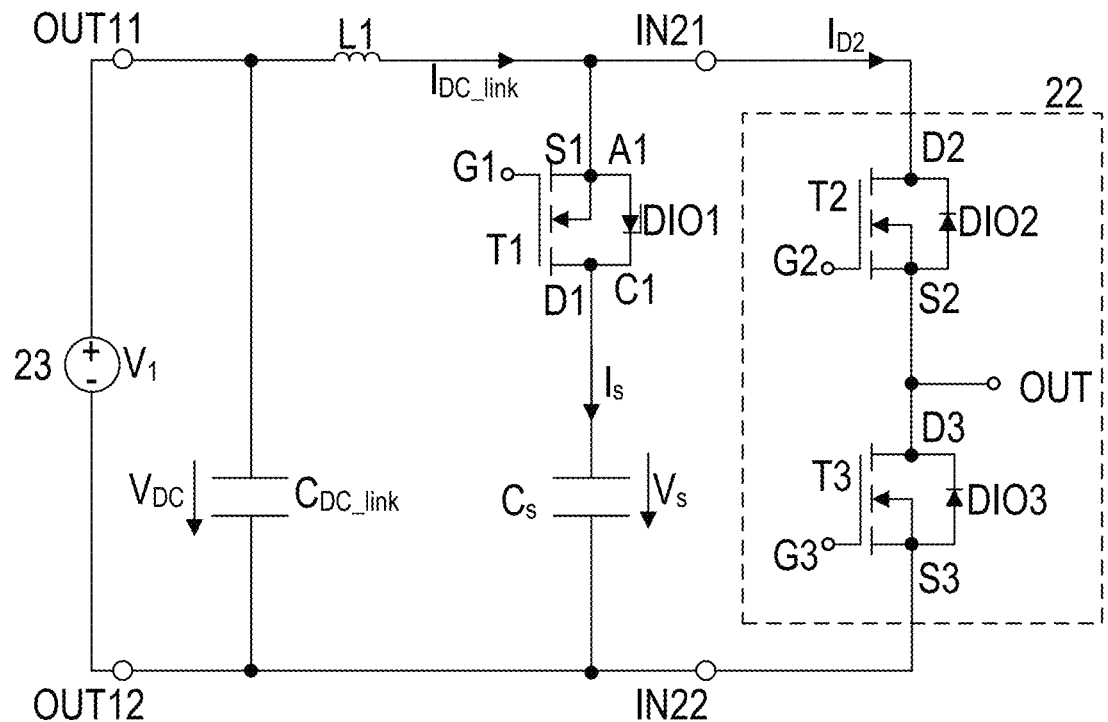
FIG. 4 is a circuit diagram of an exemplary semiconductor arrangement.

Now referring to FIG. 4, a circuit arrangement having a reduced switch-off overvoltage, a reduced oscillation amplitude during switching operations as well as reduced switching losses is schematically illustrated. The input stage is not specifically illustrated in FIG. 4. The input stage is merely indicated by means of a voltage source 23 that provides a DC voltage V1 at its output terminals OUT11, OUT12. As has been described above, it is possible that the input stage comprises a DC-DC converter, an AC-DC converter, a battery or any other kind of voltage source.

In the example illustrated in FIG. 4, the output stage 22 comprises a half-bridge. This, however, is only an example. The output stage 22 may be implemented in any other suitable way. According to one example, the output stage 22 comprises more than one half-bridge. The half-bridge in the example illustrated in FIG. 4 comprises a second and a third controllable semiconductor element T2, T3 such as IGBTs (Insulated-Gate Bipolar Transistor), MOSFETs (Metal-Oxide-Semiconductor Field-Effect Transistor), JFETs (Junction Field-Effect Transistor), or HEMTs (High-Electron-Mobility Transistor), for example, and two diode elements DIO2, DIO3.

The half-bridge is configured to convert the DC voltage V1 provided at the output of the input stage OUT11, OUT12 into an AC voltage provided at an output node OUT of the output stage 22. The AC voltage may be provided to, e.g., a load (not illustrated) that is coupled to the output node OUT of the output stage 22. The half-bridge is coupled between the third input terminal IN21 which is configured to be operatively coupled to a first electrical potential and the fourth input terminal IN22 which is configured to be operatively coupled to a second electrical potential. The first electrical potential may be a positive potential and the second electrical potential may be a negative potential to supply a DC voltage via the third and fourth input terminals IN21, IN22.

The half-bridge includes one high-side switch T2 (also referred to as second controllable semiconductor element, second transistor, or second switch) and one low-side switch T3 (also referred to as third controllable semiconductor element, third transistor, or third switch) coupled in series to each other and between the third input terminal IN21 and the fourth input terminal IN22. The half-bridge may be configured to drive a load (not specifically illustrated) at its output node OUT. The load may be an inductive load, for example. The output node OUT is electrically connected to a common node between the high-side switch T2 and the low-side switch T3.

In the circuit arrangement of FIG. 4, each controllable semiconductor element T2, T3 of the half-bridge is implemented as a MOSFET (metal-oxide semiconductor field-effect transistor). Each of the controllable semiconductor elements T2, T3 may comprise an external freewheeling diode element DIO2, DIO3 coupled in parallel to the respective controllable semiconductor element T2, T3. According to another example, each of the controllable semiconductor elements T2, T3 of the output stage 22 comprises two or more separate switching elements electrically coupled in parallel to each other (not specifically illustrated).

Each of the second controllable semiconductor element T2 and the third controllable semiconductor element T3 includes a control electrode G2, G3 and a controllable load path between a first load electrode (e.g., source electrode) S2, S3 and a second load electrode (e.g., drain electrode) D2, D3. The load paths of the second controllable semiconductor element T2 and the third controllable semiconductor element T3 are coupled in series and between the third input terminal IN21 and the fourth input terminal IN22.

The arrangement illustrated in FIG. 4 further comprises a first inductive element L1 coupled between the first output terminal OUT11 and the third input terminal IN21. A DC-link capacitor $C_{DC\_link}$ is coupled in parallel to the voltage source 23 between the first output terminal OUT11 and the second output terminal OUT12. An additional capacitor C$_s$ and a first controllable semiconductor element T1 are coupled in series and between a common node between the first inductive element L1 and the third input terminal IN21, and a common node between the second output terminal OUT12 and the fourth input terminal IN22. The first controllable semiconductor element T1 includes a control electrode G1 and a controllable load path between a first load electrode (e.g., source electrode) S1 and a second load electrode (e.g., drain electrode) D1. A first diode element DIO1 is coupled in parallel to the first controllable semiconductor element T1 and between the additional capacitor C$_s$ and the common node between the first inductive element L1 and the third input terminal IN21. The first diode element DIO1 comprises an anode terminal A1 and a cathode terminal C1. The anode terminal A1 of the first diode element DIO1 is coupled to the common node between the first inductive element L1 and the third input terminal IN21. The cathode terminal C1 of the first diode element DIO1 is coupled to the additional capacitor C$_s$.

In the arrangement illustrated in FIG. 4, a stray inductance is comparably high when switching on one of the controllable semiconductor elements T2, T3 of the output stage 22 while the first controllable semiconductor element T1 is switched off (T1 in a blocking state). This is, because a commutation path in this first case passes through the first inductive element L1. The stray inductance is comparably low when switching off one of the controllable semiconductor elements T2, T3 of the output stage 22 while the first controllable semiconductor element T1 is switched on (T1 in a conducting state). This is, because a commutation path in the latter case passes through the additional capacitor C$_s$. That is, the effective stray inductance changes dependent on whether the first controllable semiconductor element is switched on or off. This allows for a fast switching of the controllable semiconductor elements T2, T3 of the output stage 22. The circuit arrangement is not operated resonantly or quasi resonantly. Further, the circuit arrangement does not require any additional capacitive elements coupled in parallel to the controllable semiconductor elements T2, T3 of the output stage 22.

The additional capacitor C$_s$ is coupled as close as possible (in close proximity) and as low inductive as possible to the controllable semiconductor elements T2, T3 of the output stage 22. Close and low inductive in this context means that the parasitic inductance in the loop comprising the additional capacitor C$_s$, the first controllable semiconductor element T1, the second controllable semiconductor element T2, and the third controllable semiconductor element T3 is lower than an inductance of the first inductive element L1. According to one example, the parasitic inductance L$_{par}$ is L$_{par}$<0.5*L1. According to another example, the parasitic inductance L$_{par}$ is even L$_{par}$<0.1*L1.

In the example illustrated in FIG. 4, the first controllable semiconductor element T1 and the first diode element DIO1 allow for the additional capacitor C$_s$ to be charged even if the first controllable semiconductor element T1 is not conducting (in a blocking state). If the first controllable semiconductor element T1 is not conducting, a current I$_s$ may flow through the first diode element DIO1 to the additional capacitor C$_s$. On the other hand, the first diode element DIO1 prevents a current from flowing in the opposite direction. That is, when the first controllable semiconductor element T1 is in a blocking state, the additional capacitor C$_s$ may be charged, and at the same time a current is prevented from flowing from the additional capacitor C$_s$. The additional capacitor C$_s$, therefore, remains charged until the first controllable element T1 is switched on (in a conducting state).

If the parasitic inductance L$_{par}$ in the loop C$_s$, T1, T2, T3 is negligibly small, the minimally required capacity of the additional capacitor C$_s$ may be calculated as follows:

$$0.5 * L1 * I_{Last}^2 = 0.5 * C_s * (V_{max} - V_{DC})^2$$

$$C_s = \frac{L1 * I_{Last}^2}{(V_{max} - V_{DC})^2}$$

with L1 being the inductance of the first inductive element L1, I$_{Last}$ being a load current provided to a load coupled to the output node OUT of the output stage 22, C$_s$ being a capacitance of the additional capacitor C$_s$, V$_{max}$ being a maximally permissible over voltage the arrangement can withstand without permanent damage, and V$_{DC}^2$ being a voltage over the DC-link capacitor C$_{DC\_link}$.

According to one example the following applies: V$_{DC}$=600V, V$_{max}$=750V, I$_{Last}$=300A and L1=40 nH. In this example, the capacitance of the additional capacitor C$_s$ may be calculated to:

$$C_s = \frac{L1 * I_{Last}^2}{(V_{max} - V_{DC})^2} = \frac{40 \, nH * (300A)^2}{(750V - 600V)^2} = 160 \text{ nF}$$

In order to prevent energy that is stored in the first inductive element L1 before switching off a controllable semiconductor element T2, T3 of the output stage 22 from being transformed into heat, the voltage rise caused by the charging of the additional capacitor C$_s$ during switch off may be as low as possible. This requires a period duration T of the oscillating circuit formed by the first inductive element L1 and the additional capacitor C$_s$ to be significantly larger than the switching time t$_{off}$ of the controllable semiconductor elements T2, T3 of the output stage 22. For example, the period duration T of the oscillating circuit may be at least 5 times or at least 7 times the switching time t$_{off}$ of the controllable semiconductor elements T2, T3 of the output stage 22. If, for example, the voltage rise is to be limited to 30V=0.05*600V with a switch off time t$_{off}$ of 50 ns, the following applies:

$$V_s = \sqrt{\frac{L1}{C_s}} * I_{Last} * \sin(\omega t_{off})$$

For 1/ω>>t$_{off}$ it may be simplified through Taylor series development:

$$\sin(\omega t) \approx \omega t - \frac{(\omega t)^2}{6}$$

This allows to calculate the capacitance of the additional capacitor C$_s$ to:

$$C_s = \frac{I_{Last} t_{off}}{2 * 0.05 * V_{DC}} + \sqrt{\left(\frac{I_{Last} t_{off}}{2 * 0.05 * V_{DC}}\right)^2 - \frac{I_{Last} t_{off}^3}{6 * L1 * 0.05 * V_{DC}}} = 490 \text{ nF}$$

This results in a period duration T or an eigenfrequency f, respectively, of:

$$T = 2\pi\sqrt{L1C_s} = 880 \text{ ns}$$

$$f = \frac{1}{T} = 1.14 \text{ MHz}$$

For a practical interpretation a factor of about 10 to 50 results between period duration T and switch off time $t_{off}$. A smaller factor may result in increased switching losses of the first controllable semiconductor element T1, a greater factor may result in a larger and more expensive additional capacitor $C_s$.

The blocking effect of the first diode element DIO1 and the first controllable semiconductor element T1 results in a greatly reduced buffering effect of the additional capacitor $C_s$ when switching on at least one controllable semiconductor element T2, T3 of the output stage 22. Therefore, when switching on the controllable semiconductor elements T2, T3 of the output stage comparably fast, a significant voltage results over the first inductive element L1, which reduces the switching losses at switch on as compared to other arrangements. The voltage occurring over the first inductive element L1 causes the first inductive element L1 to be charged. Once the switch on operation of at least one controllable element T2 or T3 of the output stage 22 is completed, the energy stored in the first inductive element L1 commutates via the first diode element DIO1 to the additional capacitor $C_s$. Without the blocking capability of the first diode element DIO1 and the first controllable semiconductor element T1, this energy would oscillate between the first inductive element L1 and the additional capacitor $C_s$. This would cause attenuation losses in the arrangement. In the described arrangement, however, the first diode element DIO1 interrupts this oscillation after charging the additional capacitor $C_s$ and the energy will be stored in the additional capacitor $C_s$. This is exemplarily illustrated in FIG. 5, which illustrates several voltages and currents in relation to each other over time in the arrangement of FIG. 4.

Figure 5:
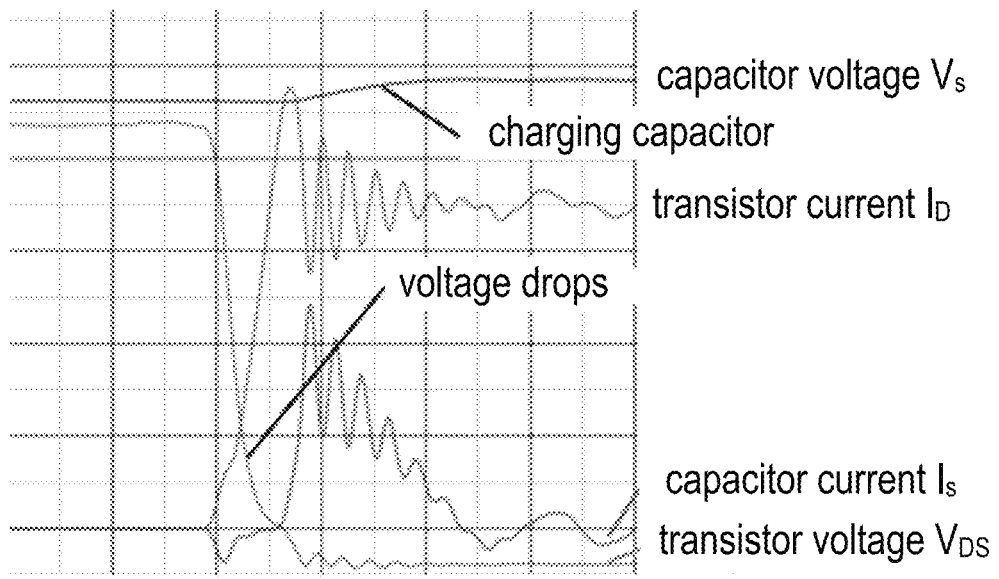
FIG. 5 schematically illustrates different voltages and currents in the semiconductor arrangement of FIG. 4 when switching on the transistor element.

FIG. 5 merely intends to illustrate the general course of the different voltages and currents. Therefore, no specific values are specified in the figure. In FIG. 5 it is indicated at which point in time the additional capacitor $C_s$ is charged. This happens slightly after the transistor voltage $V_{DS}$ of, e.g., the second controllable semiconductor element T2 drops (T2 is switched on). The transistor current $I_{D2}$ through the second controllable semiconductor element T2 rises and oscillates for a short while before evening out at a constant level. The capacitor current $I_s$ through the additional capacitor $C_s$ rises while the additional capacitor $C_s$ is being charged. As seen from the second controllable semiconductor element T2, the additional capacitor $C_s$ does not have an effect during the switch on operation.

Figure 6:
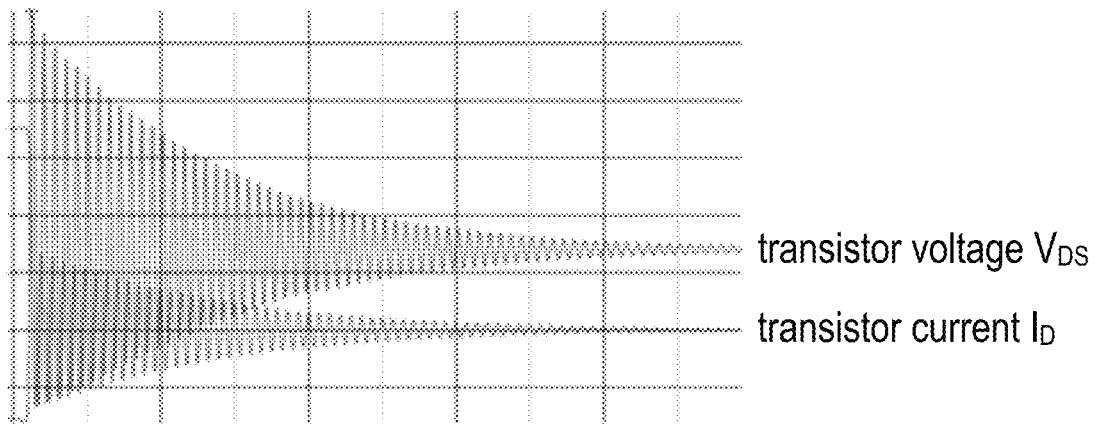
FIG. 6 schematically illustrates a transistor voltage and a transistor current after switching off one of the transistor elements of an output stage of the arrangement of FIG. 4.

When a current $I_{D2}$ flows through the respective controllable semiconductor element T2 or T3 and the corresponding controllable semiconductor element T2 or T3 is subsequently switched off, this would result in an extensive switch-off overvoltage of V1+L1*di/dt>>100V if the system did not comprise an additional capacitor $C_s$. This is schematically illustrated in FIG. 6 which illustrates the transistor voltage $V_{DS}$ and the transistor current $I_D$ after switching off the respective controllable semiconductor element T2 or T3 in an arrangement without additional capacitor $C_s$. As can be seen, the current $I_D$ that was flowing through the controllable semiconductor element T2 or T3 is initially at a certain (high) value. When switching off the controllable semiconductor element T2, T3, the transistor current $I_D$ oscillates for a certain time before evening out at a lower value (e.g., zero) while the voltage $V_{DS}$ over the controllable semiconductor element T2, T3 increases from an initially low value. The transistor voltage $V_{DS}$ rises excessively directly after switching the controllable semiconductor element off, before it evens out when the controllable semiconductor element T2, T3 is fully switched off. This overvoltage may cause severe losses in the respective controllable semiconductor element T2, T3. Such increased losses essentially correspond to the energy that was stored in the first inductive element L1 before switching off the controllable semiconductor element T2, T3. A major share of the energy is transformed into heat in the corresponding semiconductor body. The remaining part of the energy remains in the system and oscillates between the parasitic capacitance of the corresponding controllable semiconductor element T2 or T3 and the stray inductance, and is transformed into heat due to its ohmic parts.

Figure 7:
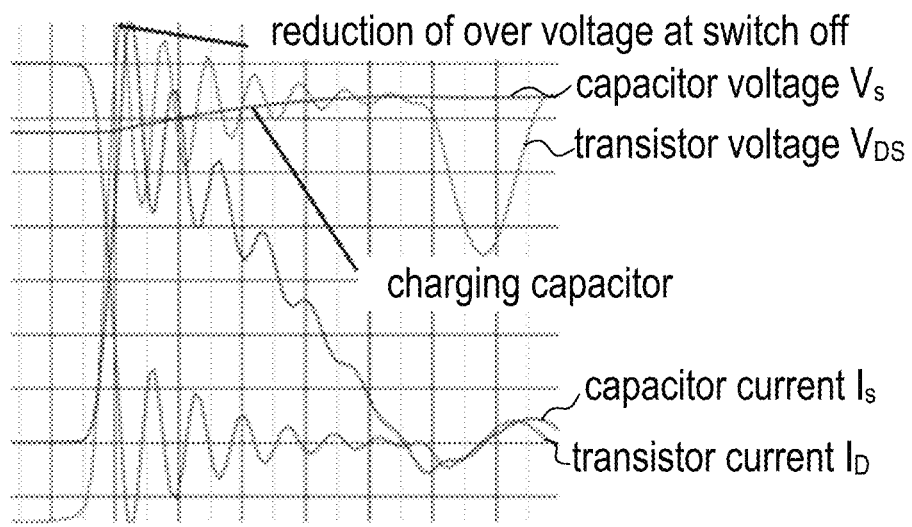
FIG. 7 schematically illustrates different voltages and currents in the semiconductor arrangement of FIG. 4 when switching off one of the transistor elements.

In the arrangement of FIG. 4, this problem is solved by allowing the energy previously stored in the first inductive element L1 to commutate to the additional capacitor $C_s$. The first diode element DIO1 conducts a current as soon as the transistor voltage $V_{DS}$ at switch off of the controllable semiconductor element T2, T3 exceeds the voltage over the additional capacitor $C_s$. The current then flows from the first inductive element L1 to the additional capacitor $C_s$. When the capacitor voltage $V_s$ reaches its maximum value (capacitor current $I_s$=0) the first diode element DIO1 blocks and the additional capacitor $C_s$ holds the energy. This is schematically illustrated in FIG. 7.

The overvoltage occurring when switching off the controllable semiconductor element T2 or T3 is reduced, which results in a parasitic transistor capacity (parasitic capacity of the corresponding controllable semiconductor element T2, T3) that is charged significantly less than in an arrangement without the additional capacitor $C_s$ in the moment at which the channel of the controllable semiconductor element T2, T3 is closed (controllable semiconductor element T2, T3 blocks completely). This results in an oscillation amplitude which is significantly smaller than in arrangements without the additional capacitor $C_s$.

In the examples described above, the first controllable semiconductor element T1 has been assumed as non-conducting (blocking). With each switching operation an oscillation between the first inductive element L1 and the additional capacitor $C_s$ has been interrupted by the first diode element DIO1. The oscillation energy is stored in the additional capacitor $C_s$ and may subsequently be used in different ways. One exemplary way to use the energy stored in the additional capacitor $C_s$ will be described in the following.

According to a first example, the first inductive element L1 is charged during the switch on operation of a controllable semiconductor element T2 or T3 of the output stage. The energy that is stored in the first inductive element is then stored in the additional capacitor $C_s$ before the controllable semiconductor element T2 or T3 is switched off again. The higher the quality of the oscillating circuit, the more energy from the first inductive element L1 may be stored in the additional capacitor $C_s$.

According to one example, the first controllable semiconductor element T1 is switched on (changes from a blocking state to a conducting state) before switching off the controllable semiconductor element T2 or T3. When the first controllable semiconductor element T1 is switched on, the additional capacitor $C_s$ discharges. The resulting discharge current from the additional capacitor $C_s$ overlaps with the current of the first inductive element L1. The course of the resulting currents and voltages corresponds to the course of the currents and voltages of an LC-oscillation. The respective frequency and period duration T may be calculated to be:

$$f_{sw} = \frac{1}{2\pi\sqrt{L1C_s}}$$

$$T_{sw} = 2\pi\sqrt{L1C_s}$$

Figure 8:
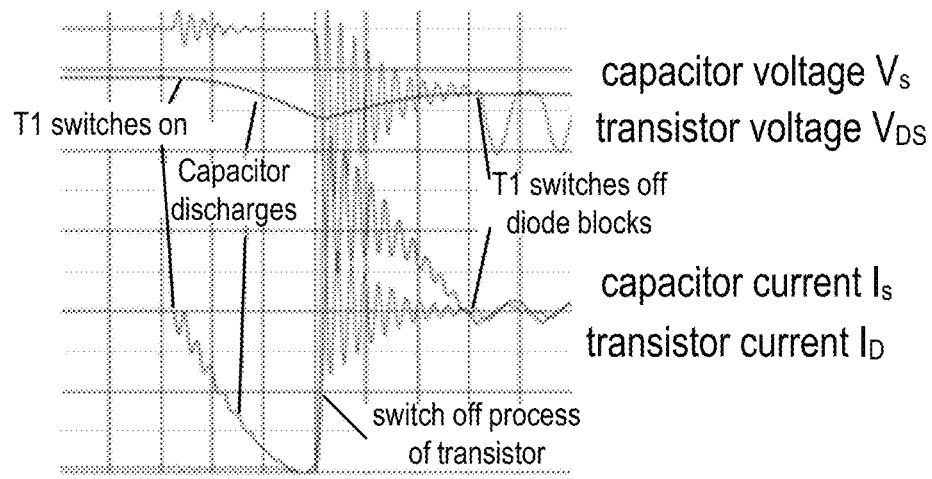
FIG. 8 schematically illustrates different voltages and currents in the semiconductor arrangement of FIG. 4 resulting from switching on and off a transistor in the arrangement of FIG. 4 according to a first example.

If the quality of the oscillating circuit is high, the current $I_s$ in the additional capacitor $C_s$ reaches its maximum value after a quarter oscillation period. The more energy is stored in the additional capacitor $C_s$, the higher the current in the additional capacitor $C_s$ may get. In a real system in which attenuation losses occur, the current in the additional capacitor $C_s$ may not fully off-commutate the current $I_{DC\_link}$ from the first inductive element L1. When the current $I_s$ through the additional capacitor $C_s$ reaches its maximum, the voltage $V_s$ over the additional capacitor $C_s$ corresponds to the first voltage V1. This is schematically illustrated in FIG. 8. In FIG. 8 the time instant at which the first controllable semiconductor element T1 is switched on is indicated. In the following, the additional capacitor $C_s$ discharges. Once the additional capacitor $C_s$ is discharged, the controllable semiconductor element T2 or T3 that was previously conducting is switched off. The transistor current $I_{D2}$ settles towards zero. The current $I_s$ through the additional capacitor $C_s$ rises until the first controllable semiconductor element T1 is switched off again. The voltage $V_s$ over the additional capacitor $C_s$ drops while the first controllable semiconductor element T1 is conducting. The voltage $V_{DS}$ over the controllable semiconductor element T2 or T3 rises after switching off the respective controllable semiconductor element T2 or T3.

After switching off the controllable semiconductor element T2 or T3, the energy remaining in the first inductive element L1 is discharged to the additional capacitor $C_s$. As the first controllable semiconductor element T1 is in a conducting state only for half an oscillation period, and further switches back off at the time of the zero crossing of the current $I_s$ through the additional capacitor $C_s$, the average losses of the first controllable semiconductor element T1 are comparably low which allows to design the corresponding semiconductor body comparably small in size.

Figure 9:
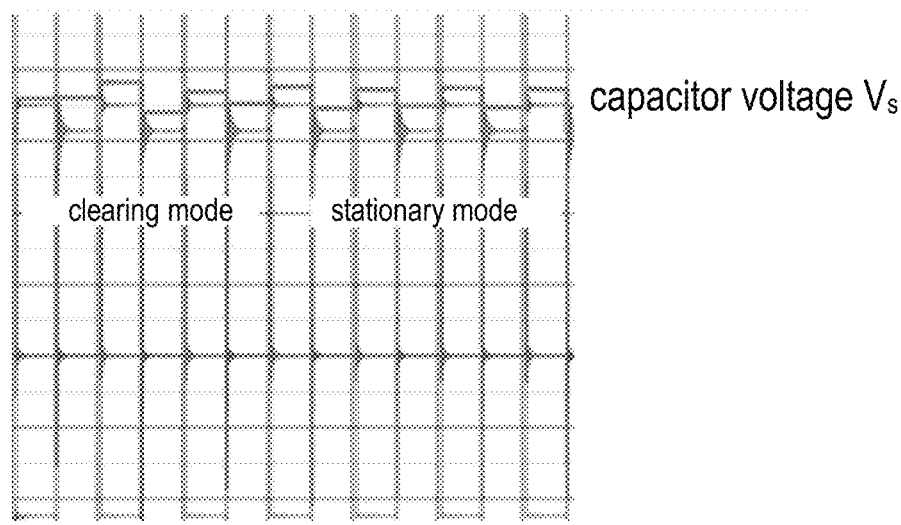
FIG. 9 schematically illustrates a voltage over the additional capacitor in the semiconductor arrangement of FIG. 4 according to the first example.

In order to keep the period duration T of the oscillation constant and further to prevent the timing of the first controllable semiconductor element T1 and the switching signals that switch on and off the controllable semiconductor elements T2 and T3 of the output stage to require extensive tracking within the control circuitry, the additional capacitor $C_s$ may be implemented as a linear, that is voltage and temperature independent, capacitor. Further switching operations result in a clearing mode during which the voltage $V_s$ over the additional capacitor $C_s$ evens out before and after the switching operations of the controllable semiconductor elements T2 or T3 of the output stage 22. This is schematically illustrated in FIG. 9.

According to an even further example, the energy that is stored in the first inductive element L1 may be stored in the additional capacitor $C_s$ when the controllable semiconductor element T2 or T3 of the output stage is switched off. This allows to store the energy of several switching operations.

Figure 10:
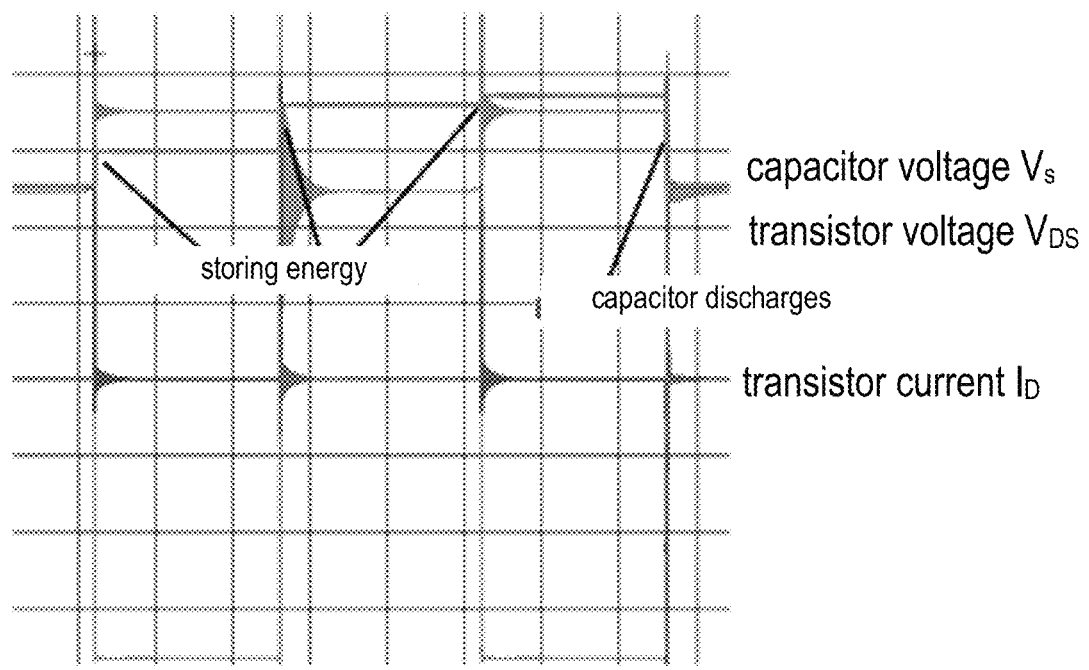
FIG. 10 schematically illustrates different voltages and currents in the semiconductor arrangement of FIG. 4 according to a second example.

As compared to the example described above, the current Ipc link through the first inductive element L1 may be off-commutated completely. This alternative may provide benefits for arrangements wherein the oscillating circuit, e.g., due to design reasons, has a comparably low quality. Voltages and currents occurring in an arrangement operated according to his alternative are schematically illustrated in FIG. 10. In FIG. 10, the time instants at which energy is stored in the additional capacitor $C_s$ are indicated. The FIG. shows the voltage $V_s$ over the additional capacitor $C_s$, the current $I_s$ through the additional capacitor $C_s$, and the voltage $V_{DS}$ over the respective controllable semiconductor element T2, T3 of the output stage 22. In other words, the first controllable semiconductor element T1 in this example remains in a blocking state (non-conducting state) for at least two switching cycles of the output stage 22, wherein each switching cycle comprises switching on and off at least one controllable semiconductor element T2 or T3 of the at least one controllable semiconductor element of the output stage 22.

According to an even further example, the energy of a switch off operation may be stored in the additional capacitor $C_s$, and the additional capacitor $C_s$ may be discharged just before the following switch off operation of a controllable semiconductor element T2 or T3 of the output stage 22. This alternative may be advantageous if the stray inductance of the arrangement is already comparably small or if the switch on operation is comparably slow. In this case, only very little energy may be stored in the additional capacitor $C_s$ when switching on the controllable semiconductor element T2, T3 of the output stage 22. Therefore, only the energy of a single switch off operation is stored. The additional capacitor $C_s$ has a voltage-limiting effect. The additional capacitor $C_s$ is discharged again just before the following switch off operation.

This last alternative provides very low losses at switch on and reduced losses at switch off. Recovery losses are average, while the attenuation losses are very low. The over voltage is low and an average sized additional capacitor $C_s$ is required. The stray inductance may be slightly increased. The arrangement may be used for any desired power range.

The additional capacitor $C_s$ and the first controllable semiconductor element T1 that have been described above may either be implemented within the same semiconductor module (the same housing 17) as the output stage 22, for example. That is, in other words, the output stage 22 may comprise the additional capacitor $C_s$ and the first controllable semiconductor element T1. This, however, is only an example. It is also possible that the additional capacitor $C_s$ and the first controllable semiconductor element T1 are implemented as an external capacitor and an external switch that are arranged outside of the housing 17 of the output stage 22.

What is claimed is:

1. A semiconductor module arrangement, comprising:
    an input stage comprising a first output terminal and a second output terminal, wherein a first inductive element is coupled to the first output terminal;
    an output stage comprising at least one first controllable semiconductor element, a third input terminal coupled to the first inductive element such that the first inductive element is coupled between the first output terminal and the third input terminal, a fourth input terminal coupled to the second output terminal, a third output terminal, and a fourth output terminal;
    a second controllable semiconductor element and a first capacitive element coupled in series and between a first common node coupled between the first inductive element and the third input terminal, and a second common node coupled between the second output terminal and the fourth input terminal; and a first diode element coupled in parallel to the second controllable semiconductor element, wherein a cathode terminal of the first diode element is coupled to the first capacitive element, and an anode terminal of the first diode element is coupled to the first common node, wherein the first inductive element and the first capacitive element form an oscillating circuit;

wherein an oscillation occurring in the oscillating circuit has a first period duration;

wherein a first switching time is used to switch a controllable semiconductor element of the at least one first controllable semiconductor element of the output stage from a conducting state to a non-conducting state, and wherein the first period duration is larger than the first switching time.

2. The semiconductor arrangement of claim 1, wherein the output stage comprises at least two first controllable semiconductor elements that are arranged in at least one half-bridge configuration.

3. The semiconductor module arrangement of claim 1, wherein the first period duration is between about 10 and about 50 times the first switching time.

4. The semiconductor module arrangement of claim 1, wherein the output stage is configured to convert a DC voltage provided at the third input terminal and the fourth input terminal into another DC voltage provided at the third output terminal and the fourth output terminal.

5. The semiconductor arrangement of claim 1, wherein the output stage is configured to convert a DC voltage provided at the third input terminal and the fourth input terminal into an AC voltage provided at the third output terminal and the fourth output terminal.

6. The semiconductor module arrangement of claim 1, further comprising a DC-link capacitor coupled between the first output terminal and the second output terminal of the input stage.

7. The semiconductor module arrangement of claim 1, wherein each of the at least one first controllable semiconductor element and the second controllable semiconductor element comprises at least one of an IGBT, a MOSFET, a JFET, or an HEMT.

8. A method for operating a semiconductor arrangement comprising an input stage comprising a first output terminal and a second output terminal, wherein a first inductive element is coupled to the first output terminal;

an output stage comprising at least one first controllable semiconductor element, a third input terminal coupled to the first inductive element such that the first inductive element is coupled between the first output terminal and the third input terminal, a fourth input terminal coupled to the second output terminal, a third output terminal, and a fourth output terminal; a second controllable semiconductor element and a first capacitive element coupled in series and between a first common node coupled between the first inductive element and the third input terminal, and a second common node coupled between the second output terminal and the fourth input terminal; and a first diode element coupled in parallel to the second controllable semiconductor element, wherein a cathode terminal of the first diode element is coupled to the first capacitive element, and an anode terminal of the first diode element is coupled to the first common node, the method comprising:

switching on at least one controllable semiconductor element of the at least one first controllable semiconductor element of the output stage, wherein the first inductive element is charged during the switch on operation of the at least one controllable semiconductor element, and wherein energy that is stored in the first inductive element during the switch on operation commutates to the first capacitive element via the first diode element once the switch on operation is completed; and switching off the at least one controllable semiconductor element of the at least one first controllable semiconductor element of the output stage.

9. The method of claim 8, wherein the second controllable semiconductor element is in a blocking state at least during the switch on operation of the at least one controllable semiconductor element.

10. The method of claim 9, further comprising
after switching on the at least one controllable semiconductor element of the at least one first controllable semiconductor element of the output stage, and before switching the at least one controllable semiconductor element of the at least one first controllable semiconductor element of the output stage off again, switching on the second controllable semiconductor element, thereby allowing the first capacitive element to discharge.

11. The method of claim 10, further comprising switching off the second controllable semiconductor element.

12. The method of claim 11, wherein the second controllable semiconductor element is switched off again either:
once the first capacitive element is fully discharged, or
after half of an oscillation period of an oscillating circuit formed by the first inductive element and the first capacitive element, or
at a time instant of a zero crossing of a current flowing through the first capacitive element.

13. The method of claim 9, wherein the second controllable semiconductor element remains in a blocking state for at least two switching cycles of the output stage, wherein each switching cycle comprises switching on and switching off the at least one controllable semiconductor element of the at least one first controllable semiconductor element of the output stage.

14. A semiconductor module arrangement, comprising:
an input stage comprising a first output terminal and a second output terminal, wherein a first inductive element is coupled to the first output terminal;

an output stage comprising at least one first controllable semiconductor element, a third input terminal coupled to the first inductive element such that the first inductive element is coupled between the first output terminal and the third input terminal, a fourth input terminal coupled to the second output terminal, a third output terminal, and a fourth output terminal;

a second controllable semiconductor element and a first capacitive element coupled in series and between a first common node coupled between the first inductive element and the third input terminal, and a second common node coupled between the second output terminal and the fourth input terminal; and a first diode element coupled in parallel to the second controllable semiconductor element, wherein a cathode terminal of the first diode element is coupled to the first capacitive element, and an anode terminal of the first diode element is coupled to the first common node, wherein, in response to switching on at least one controllable semiconductor element of the at least one first controllable semiconductor element of the output stage, the first inductive element is charged during the switch on operation of the at least one controllable semiconductor element, and wherein energy that is stored in the first inductive element during the switch on operation commutates to the first capacitive element via the first diode element once the switch on operation is completed.

15. The semiconductor module arrangement of claim 14, wherein:

after switching on the at least one controllable semiconductor element of the at least one first controllable semiconductor element of the output stage, and before switching the at least one controllable semiconductor element of the at least one first controllable semiconductor element of the output stage off again, the second controllable semiconductor element is switched on, thereby allowing the first capacitive element to discharge.

16. The semiconductor module arrangement of claim 15, wherein the second controllable semiconductor element is switched off again either:

once the first capacitive element is fully discharged, or after half of an oscillation period of an oscillating circuit formed by the first inductive element and the first capacitive element, or at a time instant of a zero crossing of a current flowing through the first capacitive element.

17. The semiconductor module arrangement of claim 14, wherein the second controllable semiconductor element remains in a blocking state for at least two switching cycles of the output stage, wherein each switching cycle comprises switching on and switching off the at least one controllable semiconductor element of the at least one first controllable semiconductor element of the output stage.

18. The semiconductor module arrangement of claim 14, wherein:

the first inductive element and the first capacitive element form an oscillating circuit;

an oscillation occurring in the oscillating circuit has a first period duration;

a first switching time is used to switch a controllable semiconductor element of the at least one first controllable semiconductor element of the output stage from a conducting state to a non-conducting state, and the first period duration is larger than the first switching time.

* * * * *